(12) United States Patent
Chen et al.

(10) Patent No.: US 6,600,316 B2
(45) Date of Patent: Jul. 29, 2003

(54) RAPID NMR MULTI-FREQUENCY $T_1$ AND $T_2$ ACQUISITION FOR EARTH FORMATIONS EVALUATION WITH MWD OR WIRELINE TOOLS

(75) Inventors: Songhua Chen, Katy, TX (US); Dan Georgi, Houston, TX (US); Thomas Kruspe, Wienhausen (DE)

(73) Assignee: Baker Hughes Incorporated, Houston, TX (US)

( * ) Notice: Subject to any disclaimer, the term of this patent is extended or adjusted under 35 U.S.C. 154(b) by 0 days.

(21) Appl. No.: 10/164,917

(22) Filed: Jun. 6, 2002

(65) Prior Publication Data
US 2003/0001569 A1 Jan. 2, 2003

Related U.S. Application Data (63) Continuation-in-part of application No. 09/863,568, filed on May 23, 2001, now abandoned.

(51) Int. Cl.[7] .................................................. G01V 3/00
(52) U.S. Cl. ...................................... 324/303; 324/306
(58) Field of Search ................................. 324/303, 306, 324/307, 309, 312, 314, 318, 322, 300

(56) References Cited

U.S. PATENT DOCUMENTS

| | | | |
|---|---|---|---|
| 6,049,205 A | 4/2000 | Taicher et al. | 324/303 |
| 6,069,477 A | 5/2000 | Chen et al. | 324/303 |
| 6,242,912 B1 * | 6/2001 | Prammer et al. | 324/303 |

FOREIGN PATENT DOCUMENTS

| | | |
|---|---|---|
| WO | WO01/13142 A1 | 2/2001 |

* cited by examiner

*Primary Examiner*—Louis Arana
(74) *Attorney, Agent, or Firm*—Madan, Mossman & Sriram, P.C.

(57) ABSTRACT

Nuclear magnetic resonance measurement of a medium are made using a tool with a static magnetic field having a gradient. The nuclear spins of the medium are magnetically polarized using the static magnetic field. Data are acquired from at least three sensitive volumes of the medium using an interleaved sequence of pulses at three different non-overlapping frequencies. At each frequency, a number of sub-sequences of a saturation pulse, a recovery pulse and at least one refocusing pulse are used. The saturation times between the saturation pulse and the recovery pulse for the sub-sequences are selected from a distribution of values between a minimum time to a maximum time to enable determination of $T_1$ and $T_2$ spectra over a wide range of values. Repetitions of sub-sequences having the same saturation at one or more frequencies may be carried out with phase alternation of the recovery pulse phases.

36 Claims, 6 Drawing Sheets

RAPID NMR MULTI-FREQUENCY $T_1$ AND $T_2$ ACQUISITION FOR EARTH FORMATIONS EVALUATION WITH MWD OR WIRELINE TOOLS

CROSS-REFERENCES TO RELATED APPLICATIONS

This application is a Continuation-in-part of U.S. patent application Ser. No. 09/863,568 filed on May 23, 2001 now abandoned. It is also related to U.S. patent application Ser. No. 09/514,724

FIELD OF THE INVENTION

The invention is related to the field of nuclear magnetic resonance ("NMR") sensing methods and measuring techniques. More specifically, the invention is related to making NMR measurements during well logging or during Measurement-While-Drilling ("MWD") within earth formations surrounding a wellbore. The invention also relates to methods for using NMR measurements to determine petrophysical properties of reservoir rocks and properties of fluids in the earth formations surrounding the wellbore.

BACKGROUND OF THE INVENTION

The description of the background of this invention, and the description of the invention itself are approached in the context of well logging because well logging is a well known application of NMR measurement techniques. It is to be explicitly understood that the invention is not limited to the field of well logging.

An apparatus described in U.S. Pat. No. 4,710,713 issued to Taicher et al is typical of NMR instruments used to measure certain petrophysical properties of earth formations from within a wellbore drilled through the earth formations. NMR well logging instruments such as the one disclosed by Taicher et al typically include a magnet for polarizing nuclei in the earth formations surrounding the wellbore along a static magnetic field, and at least one antenna for transmitting radio frequency ("RF") energy pulses into the formations. The RF pulses reorient the spin axes of certain nuclei in the earth formations in a predetermined direction. As the spin axes precess and reorient themselves into alignment with the static magnetic field, they emit RF energy that can be detected by the antenna. The magnitude of the RF energy emitted by the precessing nuclei, and the rate at which the magnitude changes, are related to certain petrophysical properties of interest in the earth formations.

There are several principal operating parameters in NMR well logging which should be optimized for efficient operation of an NMR well logging instrument. These parameters include the logging speed (speed of motion of the instrument along the wellbore), the average and the peak power supplied to the instrument and transmitted as RF pulses, and the signal-to-noise ratio ("SNR"). Other parameters of interest include the vertical resolution of the instrument and the radial depth of investigation of the measurements made by the instrument within the formations surrounding the wellbore. The last two of these parameters are primarily determined by the antenna and magnet configurations of the NMR logging instrument. Improvements to these two parameters are the subject of numerous patents and other publications. Providing more flexibility in the instrument's peak power requirements, and limitations on the logging speed necessitated by the physics of NMR measurement have been more difficult to overcome.

Proton NMR relaxation time varies for different fluid types in earth formations. In addition, pore-size distributions dictate relaxation rate of wetting-fluid protons, due to the fast surface relaxation and the diffusional mixing of protons near the matrix-fluid interface with those in the middle of pores. Thus, in general, a distribution of NMR relaxation times is often observed for protons of fluids in earth formation. A large number of data points acquired in the same dynamic range is crucial to improve the accuracy and resolution of the relaxation time distribution, particularly because MWD and wireline data are known to be contaminated with high levels of random noise. There is a difference between the longitudinal relaxation time $T_1$ distribution and the apparent transverse relaxation time $T_2$ distribution of fluids filling the pore spaces of the porous medium. The difference is due primarily to the effect of diffusion in the presence of magnetic field gradients. For example, light hydrocarbons and natural gas may have $T_1$ relaxation times of the order of several seconds, while the apparent $T_2$ relaxation times may be only about $\frac{1}{100}$ that amount because of diffusion when measurements are made in strong gradient magnetic fields. These field gradients can arise from the non-uniformly applied static magnetic field or from the earth formations themselves. The latter gradients are caused by differences in magnetic susceptibility between the solid portion of the earth formation (referred to as the rock "matrix") and the fluids filling the pore spaces: both the magnitude and direction of these gradients are difficult to predict).

In wireline NMR logging, the types of NMR measurements affects the logging speed. NMR measurements often require the nuclei of the material be polarized by the static magnetic field for more than three times the longest $T_1$ relaxation time of any individual component within the material. This requires very slow logging speeds and, in many circumstances, is unacceptable.

Typical NMR well logging measurements use pulsed NMR techniques in which RF energy is transmitted to the measurement sensitive volume in the form of a series of pulses. The most commonly used pulse sequence for logging application is the Carr-Purcell-Meiboom-Gill ("CPMG") pulse sequence. For well logging applications known in the art, the CPMG pulse sequences are about 0.01 to 1 seconds in total duration, depending on the number of individual pulses and the time span ("TE") between the individual RF pulses. Each series of CPMG pulses can be referred to as a "measurement set".

The efficiency of NMR logging is affected by the following three aspects. Firstly, the wait time between two acquisition cycles is dictated by the formation rock and fluid properties. Thus, maximizing the number of data and experiments to be acquired within one measurement cycle is desired. Secondly, power transmission duty cycle, defined as the ratio of the RF transmitting time vs. total time, is limited by the instrumentation design and the efficiency of heat dissipation. In some existing NMR logging tools, the duty cycle is as low as 3–4%. When the measurements are limited by duty cycle, the tool can not repeat the experiment as fast as the formation wait time allows. Thus, use of pulses or pulse sequences that minimize the RF power consumption yet provides the same information is desired. Thirdly, the number of repeated measurements depends on the required signal-to-noise ratio. Formation properties, such as porosity, affect the signal strength. The conductivity of formation and/or borehole affects the RF energy transmission efficiency and, consequently, the strength of noise. Different porosity distributions may also require different SNR in order to achieve a desired accuracy of porosity estimates. Specifically, faster relaxing components require higher SNR data compared to slower relaxing components. Thus, the number of experiment repeats is desired to be higher for the portion of the signal that represents fast relaxing protons most.

The CPMG sequence is commonly used for well logging applications because it acquires a series of NMR signal amplitudes of a vital decay range, time-spaced equally, within a single polarization cycle. Although TE is desired to be as short as the instrumentation permits, the short TE is beneficial primarily for resolving fast relaxing components. For slowly relaxing components, the choice of TE must be balanced with power requirements to avoid limiting the number of echos acquired. It is desirable to choose the time series in accordance with the relaxation distribution scale at which one wants to resolve the spectrum, rather than taking the data equally-spaced in time. Although CPMG is efficient in terms of a large number of echos that can be acquired within a single polarization cycle, it is not an efficient way to use available RF energy because the data are acquired equally time-spaced while the relaxation components are logarithmically time-spaced.

For MWD, where high frequency vibrations limit experiment time, the saturation-recovery sequence for $T_1$ measurement (Fukushima, and Roeder, p. 169, *Experimental Pulse NMR*, Addison-Wesley, 1981; Taicher and Reiderman, '205; Prammer, et al., SPWLA paper #EEE, Dallas, Tex., Jun. 7, 2000) is preferred to the CPMG sequence as it can be designed to be less sensitive to vibrations by using broadband saturation pulses. Despite being a relatively fast acquisition sequence compared to the inversion-recovery sequence, the saturation-recovery MWD acquisition still takes long compared to a CPMG $T_2$ acquisition and, thus, limits the number of measurements to less than ten in almost all cases. The limited sampling of the $T_1$ recovery limits ones ability to decompose the recovery times into a relaxation spectrum or, even worse, differentiate between slow and fast relaxing components.

Besides being less sensitive to vibration than CPMG, $T_1$ measurements have several other merits for formation evaluation. Firstly, unlike $T_2$, $T_1$ measurements are insensitive to proton self-diffusion in the presence of a magnetic field gradient, which appears as an additional decay mechanism in $T_2$ measurements. Therefore, interpretation of formation and fluid properties from $T_1$ is simpler. On the other hand, comparison of $T_1$ and $T_2$ information from the same formation system makes it possible to distinguish a fluid component that is diffusion dominant, such as hydrocarbon gas.

U.S. Pat. No. 6,049,205 to Taicher et al. ("Taicher '205 ") teaches a method for determining the nuclear magnetic resonance longitudinal relaxation time $T_1$ of a medium. The method is a time-efficient version of the inversion-recovery sequence for $T_1$ measurements when using multiple frequencies to excite protons in mutually non-overlapping sensitive volumes within one polarization cycle. In the method, a number, N, of 180° "inversion" pulses, one pulse at each of the excitation frequencies, $f_1$ through $f_N$, are transmitted first to invert proton spins in each of the corresponding sensitive volumes. There need be negligibly small wait time between these inversion pulses because the corresponding sensitive volumes are non-overlapping. The 180° "inversion" pulses are then followed by a first (shortest) recovery time $R_1$ after which a first read-out CPMG pulse sequence with a duration $T_{tr}$. A second CPMG follows, transmitted with a second frequency. The procedure is then extended to all N frequencies.

Taicher '205 also teaches the determination of the transverse relaxation time distribution of the medium with an improved signal-to-noise ratio. The medium is polarized along a static magnetic field. A first CPMG echo train is acquired from within a first sensitive volume. The first CPMG train has an inter-echo spacing and a duration long enough to determine the presence of slowly relaxing components in the medium. Then a plurality of additional CPMG echo trains is acquired. Each of the additional echo trains corresponds to a different sensitive volume, and each of the additional CPMG echo trains has an inter-echo spacing and a duration less than the duration and echo spacing of the first CPMG echo train. Different sensitive volumes are measured by transmitting each additional CPMG sequence at a different radio frequency. In the preferred embodiment, the additional echo trains have a duration and inter-echo spacing adapted to determine the presence of components in the formation having a transverse relaxation time less than about 33 milliseconds. The total duration of all the additional echo trains is about equal to the duration of the first echo train. In the preferred embodiment, the total radio frequency power transmitted in the all the additional echo trains is approximately equal to the radio frequency power transmitted in the first echo train.

SUMMARY OF THE INVENTION

The present invention includes a pulse sequence scheme to obtain $T_1$ and $T_2$ data that each emphasizes a specific portion of the relaxation time distribution and porosity distribution, and combining $T_1$ and $T_2$ data to obtain the porosity distribution formation rock and fluid properties. The pulse sequence is a rapid method of making nuclear magnetic resonance measurement of a medium, using an NMR tool that has a well-defined static magnetic field gradient, so that the magnetic filed strength varies spatially. The nuclear spins of the medium are magnetically polarized under the static magnetic field. Data are acquired at at least two different radio frequencies from at least two different sensitive volumes of the medium. In a preferred embodiment of the invention, more than two frequencies are used to speed the data acquisition and improve the data quality. For each of the at least two sensitive volumes, an RF pulse sequence is defined, each pulse sequence comprising at least one sub-sequence having a saturation pulse, a recovery pulse that follows the saturation pulse after a defined saturation time, and at least one refocusing pulse. In a preferred embodiment of the invention, a series of refocusing pulses is used so that a series of echoes are acquired from which a $T_2$ distribution, corresponding to either fully or partially polarized signals, can be derived. The wait times for the sub-sequences of the various sensitive volumes are selected from a distribution of values between a minimum time to a maximum time. In a preferred embodiment of the invention, the data acquisitions for $T_1$ and $T_2$ decay data are interleaved among multiple frequencies. Specifically, during the wait time between the saturation pulse and the recovery pulse of the first frequency activation, data acquisition of one or more additional frequencies are started and data acquisition of these frequencies may be completed before or after the data acquisition of the first frequency. The interleaving pattern can be either regular or irregular. The interleaving may be nested. Typically, the minimum and maximum wait times are set at 0.1 ms. and 10 seconds. The distribution of wait times may follow a power law relationship approximately to be in accordance with the desired resolution scale of the $T_1$ and $T_2$ spectrum. The wait times for two sub-sequences at a particular frequency may be the same: in such a case, the corresponding refocusing pulses are phase alternated, making it possible to reduce the effects of ringing.

In a preferred embodiment of the invention, the bandwidth of the saturation pulse or pulses for a sensitive volume is greater than or equal to the bandwidth of the corresponding recovery and refocusing pulses. The frequency—separation of the RF pulses—is chosen to be greater than the bandwidth of the RF excitation pulses in the sequence.

In another embodiment of the invention,-echo trains acquired with different wait times can be stacked to improve the signal to noise ratio. The resultant echo train is inverted to obtain a $T_2$ spectrum. Preferably, only the fully polarized $T_2$ components (fast relaxing components) may be analyzed and partially polarized components are discarded. The number of echos (NE) following individual recovery pulse can be the same or different. Even if the individual NE parameters are different, they can still be averaged. The $T_2$ data are used to interpret earth formation and reservoir fluid properties that have characteristically fast relaxation times while the $T_1$ spectrum is used to interpret properties that have characteristically longer relaxation times (e.g., greater than 3 ms). The total porosity is obtained from the echo train acquired after the longest wait time after the saturation pulse. This wait time is sufficiently long to ensure the achievement of full polarization of all relaxation-time components. The total porosity is used as a constraint in the process to combine $T_1$ and $T_2$ spectra.

DESCRIPTION OF THE PREFERRED EMBODIMENT

An NMR well logging apparatus which is suitable for use with this invention is described, for example, in U.S. Pat. No. 5,712,566 to Taicher et al ("Taicher '566"). The apparatus described in Taicher '566 includes a magnet for inducing a static magnetic field in the earth formations. The static magnetic field includes an amplitude gradient directed radially inwardly towards the longitudinal axis of the instrument. The apparatus disclosed in Taicher '566 includes an antenna through which pulses of RF power are conducted to excite nuclei of the earth formations surrounding the instrument. The antenna includes a wire coil wound around a high magnetic permeability ferrite. The ferrite includes a frequency control coil wound thereon. By passing a selectively controllable DC voltage through the frequency control coil, the tuning frequency of the antenna can be selectively controlled, making transmission and reception of RF energy at the selected frequency. The apparatus disclosed in Taicher '566 can make NMR measurements at a plurality of different frequencies. Since the static magnetic field imparted by the magnet disclosed in Taicher '566 includes an amplitude gradient, conducting NMR measurements at different frequencies will result in these different frequency NMR measurements taking place in different sensitive (excitation) volumes.

It is to be clearly understood that the apparatus disclosed Taicher '566 is not the only apparatus that can be used for this invention. For purposes of this invention it is only necessary that the NMR apparatus be able to selectively excite different sensitive volumes to nuclear magnetic resonance, and selectively receive NMR signals from each of the selectively excited sensitive volumes. Using multiple frequencies for individual NMR measurement sequences in a gradient static magnetic field is a particularly convenient means by which to carry out the method of this invention, and so the apparatus disclosed in Taicher '566 is a particularly convenient instrument, but not the exclusive instrument by which to carry out the method of this invention.

Figure 1:
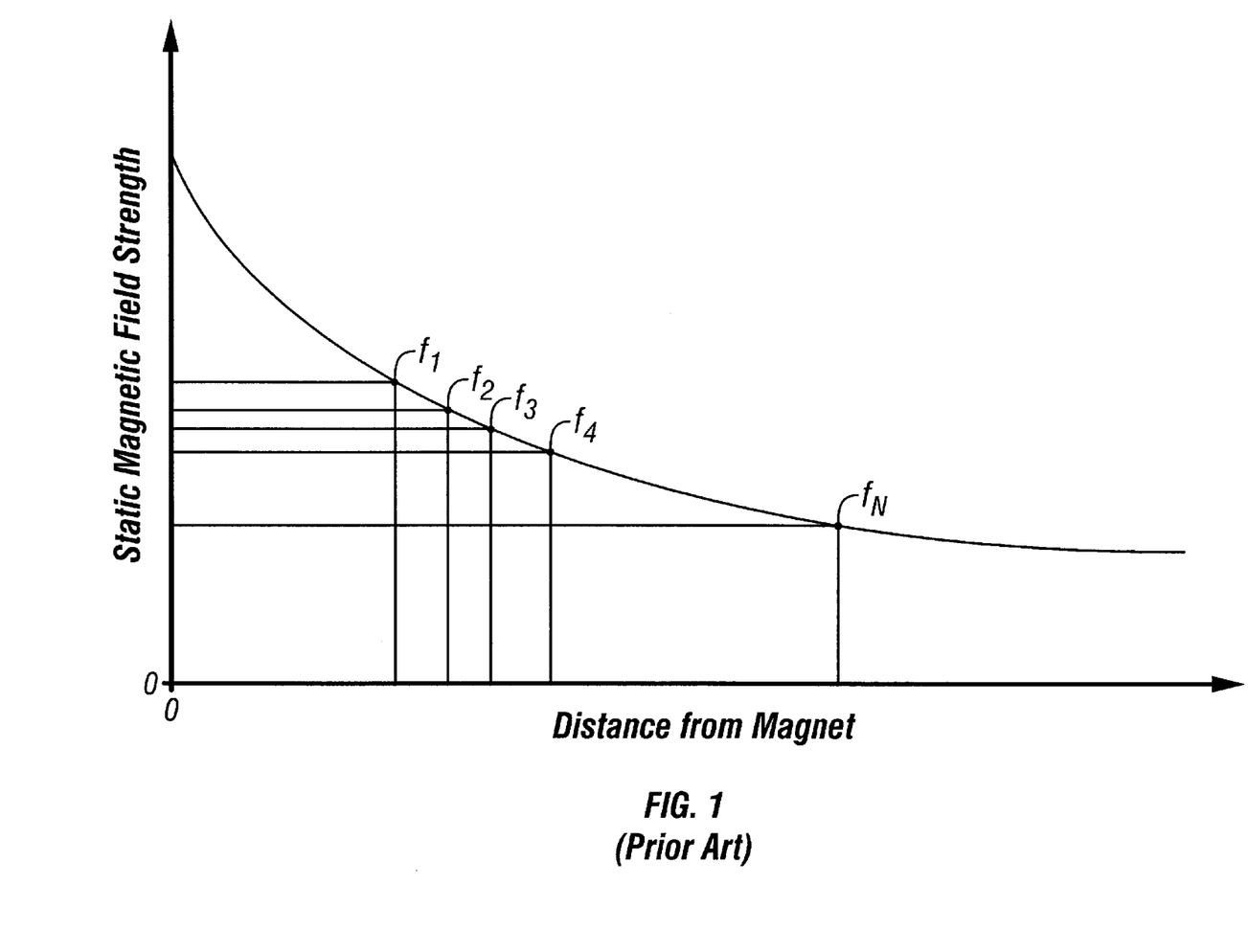
FIG. 1 shows a graph of amplitude of the static magnetic field of the magnet in a gradient NMR well logging apparatus used with the invention.

FIG. 1 shows a graph of the amplitude of the static magnetic field, with respect to distance from the magnet, for the well logging apparatus described in Taicher '566. The amplitude of the static magnetic field generally decreases with respect to the lateral distance from the magnet. As is well known in the art, nuclear magnetic resonance conditions occur when a radio frequency magnetic field is applied to materials polarized along a static magnetic field where the frequency of the RF magnetic field matches the product of the static magnetic field strength and the gyromagnetic ratio of the nuclei being polarized by the static magnetic field, this product being referred to as the Larmor frequency. As can be inferred from the graph in FIG. 1, by adjusting the frequency of the RF magnetic field, the distance from the magnet at which nuclear magnetic resonance conditions occur can be changed corresponding to the static magnetic field amplitude at that particular distance from the magnet. For example, if frequency $f_1$ is the highest frequency, resonance will occur at the smallest distance to the magnet, and so on through lower frequencies $f_2$ through $f_N$. Because nuclear magnetic resonance only occurs where the static magnetic field strength matches the RF magnetic field frequency, nuclear magnetic resonance measurements can be conducted within a number of different non-overlapping sensitive volumes by inducing nuclear magnetic resonance at different frequencies. A particular set of non-overlapping sensitive volumes which would result when using the apparatus described in Taicher '566, for example, would comprise thin annular cylinders each having an average radius corresponding to the particular static magnetic field amplitude in which nuclear magnetic resonance would occur at a particular RF magnetic field frequency. The thickness of each annular cylinder would be related to the bandwidth of the transmitted RF pulses, the bandwidth of a receiver circuit in the NMR instrument and the rate at which the static magnetic field changes in amplitude.

This feature of the static magnetic field, and the selectable frequency capability for the RF magnetic field in the apparatus described in Taicher '566 makes it possible to conduct time-overlapping NMR measurements within different sensitive volumes. By time-overlapping NMR experiments in different sensitive volumes, it is possible to more efficiently use the RF transmitting components in the apparatus. The manner in which the RF transmitting components are used more efficiently will now be explained.

Figure 2:
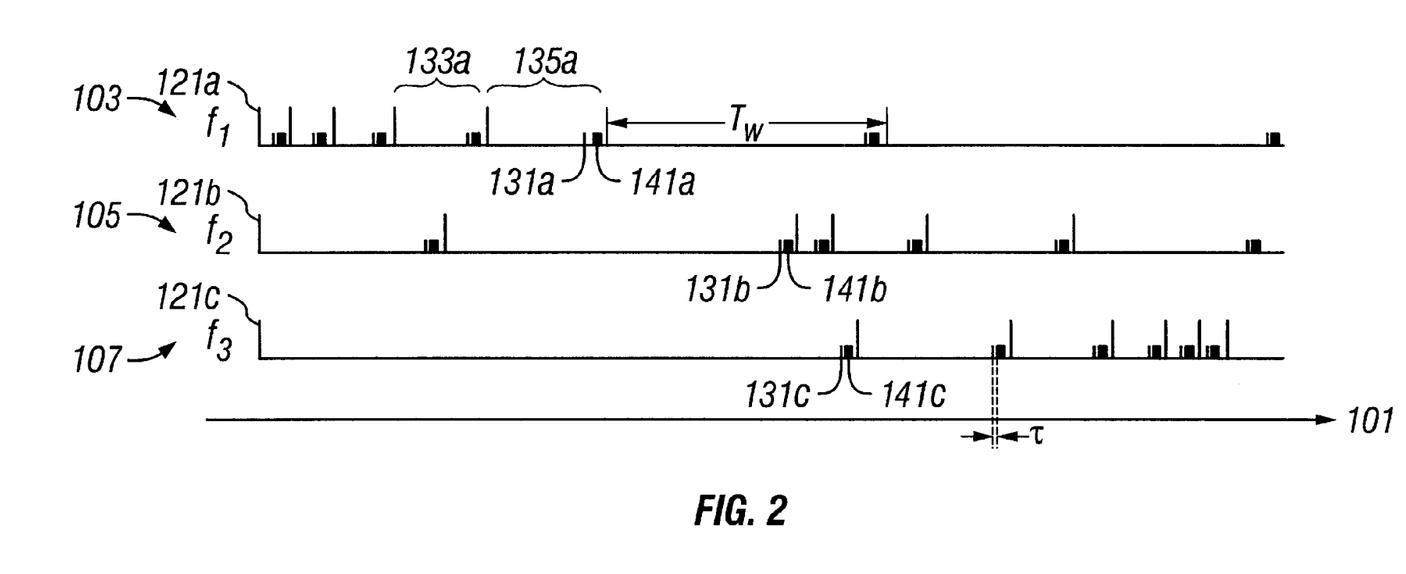
FIG. 2 shows an example of an acquisition scheme according to the present invention.

By way of example, the interleaving of frequencies in the present invention is illustrated using a three-frequency acquisition sequence. The pulse sequences at the three frequencies are interleaved. The method of the present invention requires a minimum of two frequencies in order to provide the benefit of a reduced total acquisition time compared to prior art methods. Referring now to FIG. 2, three defined pulse sequences 103, 105 and 107 are illustrated. These correspond to different RF frequencies $f_1$, $f_2$ and $f_3$ and different regions of investigation as illustrated in FIG. 1. For clarifying the invention, the three different defined pulse sequences are shown separately, though in actual practice they would be interleaved. The abscissa 101 is time, and, to simplify the illustration, the scale is logarithmic.

At each of the three frequencies, the defined pulses are depicted according to a code: this too is for the purpose of simplifying the illustration. The three different pulse types, saturation, recovery, refocusing pulses are represented by different line types. The long, thin lines such as 121a, 121b, 121c represents saturation RF pulses; the short, thin lines such as 131a, 131b, 131c represent the recovery RF pulses; and the short, thick lines such as 141a, 141b, 141c represents one or more refocusing pulses. For simplifying the illustration, the individual refocusing pulses within each group such as 141a, 141b, 141c are not shown. The aim of the saturation pulse is to destroy the magnetization. The saturation pulse comprises one pulse or a sequence of pulses, which may even be modulated in amplitude or phase or both for maximum efficiency. Details would be known to people versed in the art of NMR. The recovery pulse is a 90° pulse.

Those versed in the art would recognize that each of the refocusing pulses with a group such as 141a, 141b, 141c is followed by an echo (also not shown). These echoes are received by a suitable antenna on the NMR instrument. The pulses of same types are identical in pulse shapes and the flip angles for all frequencies. In a preferred embodiment of the invention, the time $\tau$ at each frequency between a recovery (R) pulse and the first refocusing pulses (F) pulse is fixed though the time $\tau$ may be different for the different frequencies. The time $T_w$ between a saturation (S) pulse and the following recovery pulse is variable. Each frequency is individually calibrated: as would be known to those versed in the art, data acquired from the same sample, e.g. in a water tank, may have different quality factor (Q), different bandwidth, etc. This can result in signal strength differences when making measurements on the same sample. The calibration procedure compensates for these differences. This is a routine procedure for multi-frequency tools.

The defined pulse sequence corresponding to a single frequency such as $f_1$ may then be viewed as comprising a plurality of sub-sequences such as 133a, 135a. Each of the sub-sequences comprises a saturation pulse followed by a recovery pulse delayed by a time $T_w$ relative to the saturation pulse. The recovery pulses are, in turn, followed by at least one refocusing pulse after a time $\tau$. The time delay $T_w$ may be referred to as an evolution time or saturation recovery time. Those versed in the art would recognize that with the pulses as shown, the method would be equally applicable if specific saturation pulses were missing and the sequence of refocusing pulses at the end of an earlier sub-sequence would perform the saturation. For this reason, when the term "saturation pulse" is used in this document, it is to be understood that it also includes pulses at the end of a prior sub-sequence.

The RF pulses are frequency-selective pulses. The S pulses preferably are broader band, broader than the R and F pulses. However, in order to avoid interference with pulses having an adjacent frequency, the bandwidth of the S pulses must be less than the frequency separations between two adjacent frequencies. The F pulses could be between 90° and 180°. The use of such refocusing pulses of less than 180° for reducing power consumption has been taught in U.S. Pat. No. 6,163,153 to Reiderman at al. In a preferred embodiment of the invention, the phase of the R pulses at a particular frequency is alternated between +and −90°. In a preferred embodiment of the invention, the time $\tau$ is between 0.2–0.5 ms but other values may be used when appropriate.

For a medium that can be represented by a discrete $T_1$ spectrum with components $T_{1k}$, the total polarization following a time $T_w$, is given by $$M(T_w) = \sum_k [M_{0k}(1 - e^{-T_w/T_{1k}})] \qquad (1)$$

where $M_{0k}$ represents the density of the $T_1$ spectrum.

As an example, to cover a range of relaxation times from 1 ms. to 10 seconds, a set of 22 $T_w$ values can be chosen as $3^k$ ms, where k=[0, 0.4, 0.8, . . . 8, 8.4] by the following values:

[1, 1.55, 2.41, 3.74, 5.80, 9.0, 14.0, 21.7, 33.6, 52.2, 81.0, 126.0, 195.0, 303.0, 470.0, 729.0, 1131.0, 1756.0, 2724.0, 4228.0, 6571.0, 10181.0]

These values then can be assigned among all frequencies. The way to assign these $T_w$ values is arbitrary, and it is not necessary that the long and short $T_w$ values are approximately equally divided among these frequencies. The longest $T_w$ data acquisition spans across several short $T_w$ intervals. The actual $T_w$ values only need to be approximately those shown above; exact values are not required. The flexibility is important to avoid overlapping of the rf pulses from different frequencies to occur at an exact time instance.

The power law dependency for the times $T_w$ results in a substantially constant resolvability of the $T_1$ spectrum. A conceptually similar yet different realization method has been discussed with respect to resolving the $T_2$ spectrum in co-pending U.S. patent application Ser. No. 09/778,554 of Edwards, having the same assignee as the present application and follows from a discussion in an article entitled "Quantitative Interpretation of NMR Relaxation Data" in the Journal of Magnetic Resonance, 1989, pp 134–152, Whitall and Mackay (1989). In that approach, a variable number of repeated experiments are used in averaging CPMG echo data, with higher multiples used for early echos than the later ones. Such an approach is applicable for measurements where the time interval between data points being a constant (i.e., linear scale) but the solution of the relaxation spectrum to be resolved is not in linear scale (i.e., logarithmic scale). In the present art, the $T_w$ values are not linearly time-spaced but chosen to be commensurate to the scale in which the underlying $T_1$ spectrum is resolved.

If more frequencies are used, the $T_w$ value can be chosen more closely spaced, e.g., using $3^k$ ms, where k=[0, 0.2, 0.4, 0.6 . . . 8.0, 8.2, 8.4] for 43 values covering the same range (1 ms to 10 s). The actual $T_w$ values should be chosen in accordance with the formation characteristics, the in-situ fluid types, and the time available to complete the experiment.

In a preferred embodiment of the invention, the frequency separation between adjacent RF frequencies is chosen such that negligible overlap between the adjacent frequency bands occurs. If more than two frequencies are used, the individual separations between the adjacent frequencies can be the same or different.

In an alternate embodiment of the invention, the pulse acquisition method described above is generalized to include repeats of a few $T_w$ values and the repeats can be acquired with the same or different frequencies. The repetition makes it possible to improve the SNR corresponding to short $T_w$ values for the weakest signals. This is useful in analyzing earth formations in which the short relaxation time components (e.g., capillary bound fluid) are important.

The acquisition pulse sequence used in the invention is then obtained by interleaving the defined pulse sequences for the individual frequencies $f_1$, $f_2$ and $f_3$. As noted above, the pulse sequences for the individual frequencies $f_1$, $f_2$ and $f_3$ in turn, are made up of sub-sequences comprising a saturation pulse, a recovery pulse and one or more refocusing pulses. As shown in FIG. 2, the interleaving is done in such a manner that the recovery pulse, the at least one refocusing pulse, and the subsequent saturation pulse at a particular frequency fall within the duration of a recovery time $T_w$ of another frequency.

Figure 3A:
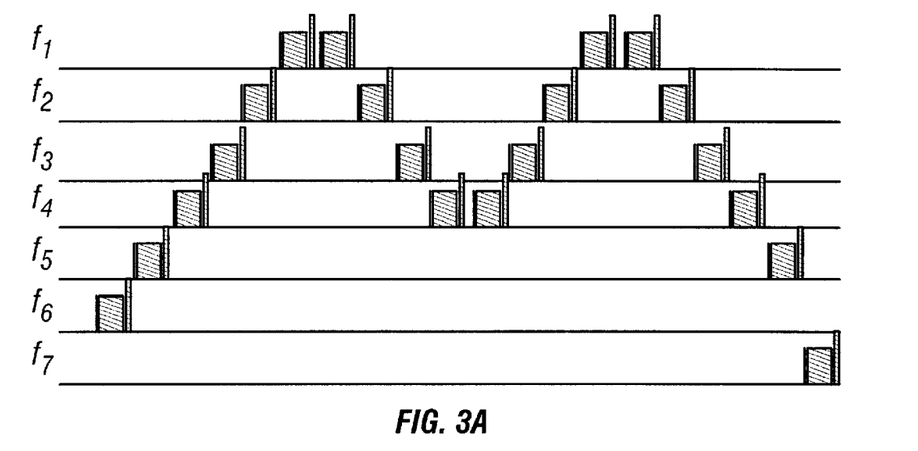
FIGS. 3A and 3B show examples of regular and irregular interleaving of frequencies.
Figure 3B:
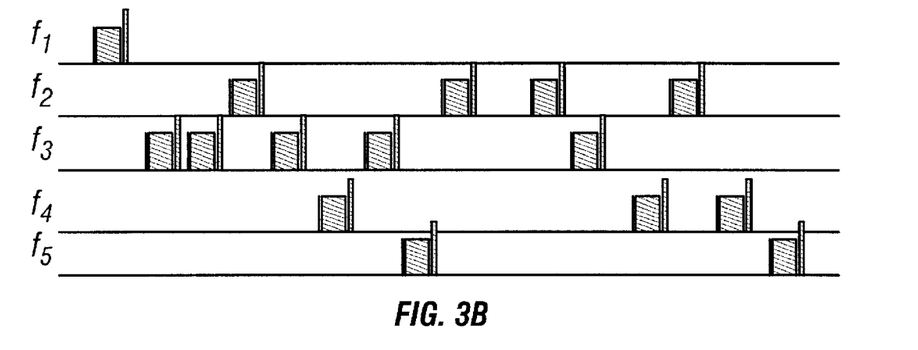

As noted above, the interleaving of frequencies may be regular or irregular. FIG. 3a shows an example of regular interleaving of frequencies $f_1 \ldots f_7$. FIG. 3b shows an example of irregular interleaving of frequencies. The same coding as in FIG. 2 is used, i.e., a single tall pulse is a saturation pulse, a single short pulse is a recovery pulse and a block represents a series of refocusing pulses and corresponding echoes.

In an alternate-embodiment of the invention, the methods described above (single values of $T_w$ or repetitions of $T_w$) can be further generalized to include $T_2$ measurements of components in the very short $T_2$ range. This is achieved by specifically incorporating several refocusing pulses with an equal spacing of TE=2τ and analyzing the corresponding echoes. The number of these refocusing pulses is generally in the neighborhood of ten. The purpose of these short echo trains are for the estimation of fast decay components, i.e., to estimate the $T_2$ spectra from the minimally recoverable $T_2$ component to a pre-defined $T_{2c}$. In the present embodiment, $T_{2c}$ can be chosen as 3 ms, the commonly used cutoff for clay bound water porosities. However, the value of $T_{2c}$ is not limited as such. The echo signal $Echo_l$ may be denoted by $$\text{Echo}_l = \sum_j M_{0j} e^{-lTE/T_{2j}} + \sum_k M_{0k} e^{-lTE/T_{2k}} (1 - e^{-T_w/T_{1k}}) \qquad (2)$$

The first term on the right hand side of the eq. (2) represents the contributions from the fast relaxing components that are fully polarized following a wait time of $T_w$ while the second term on the right hand side of eq. (2) represents the contributions from the slower relaxing components that are only partially polarized following a wait time of $T_w$. The number of relaxation components that are fully polarized is of course dependent on $T_w$, however, since the purpose of using the $T_2$ spectra is to estimate those components with $T_2 \leq T_{2c}$, the polarization status for the slower relaxation components with $T_2 \geq T_{2c}$ is not important. Consequently, the echo train acquired after the individual $T_{wm}$ values can be averaged to improve signal-to-noise ratio as long as the averaging process includes only those echo trains acquired with $T_{wm} \geq T_{wc}$ where $T_{wc}$ is sufficiently long to allow porosity components corresponding to $T_2 \leq T_{2c}$ being substantially fully polarized. Summing eq. (2) over the echo trains corresponding to the plurality of wait times gives the result $$\sum_m \text{Echo}_l(T_{wm}) = \qquad (3)$$

$$\sum_m \left[ \sum_j M_{0j} e^{-lTE/T_{2j}} + \sum_k M_{0k} e^{-lTE/T_{2k}} (1 - e^{-T_{wm}/T_{1k}}) \right].$$

Figure 4A:
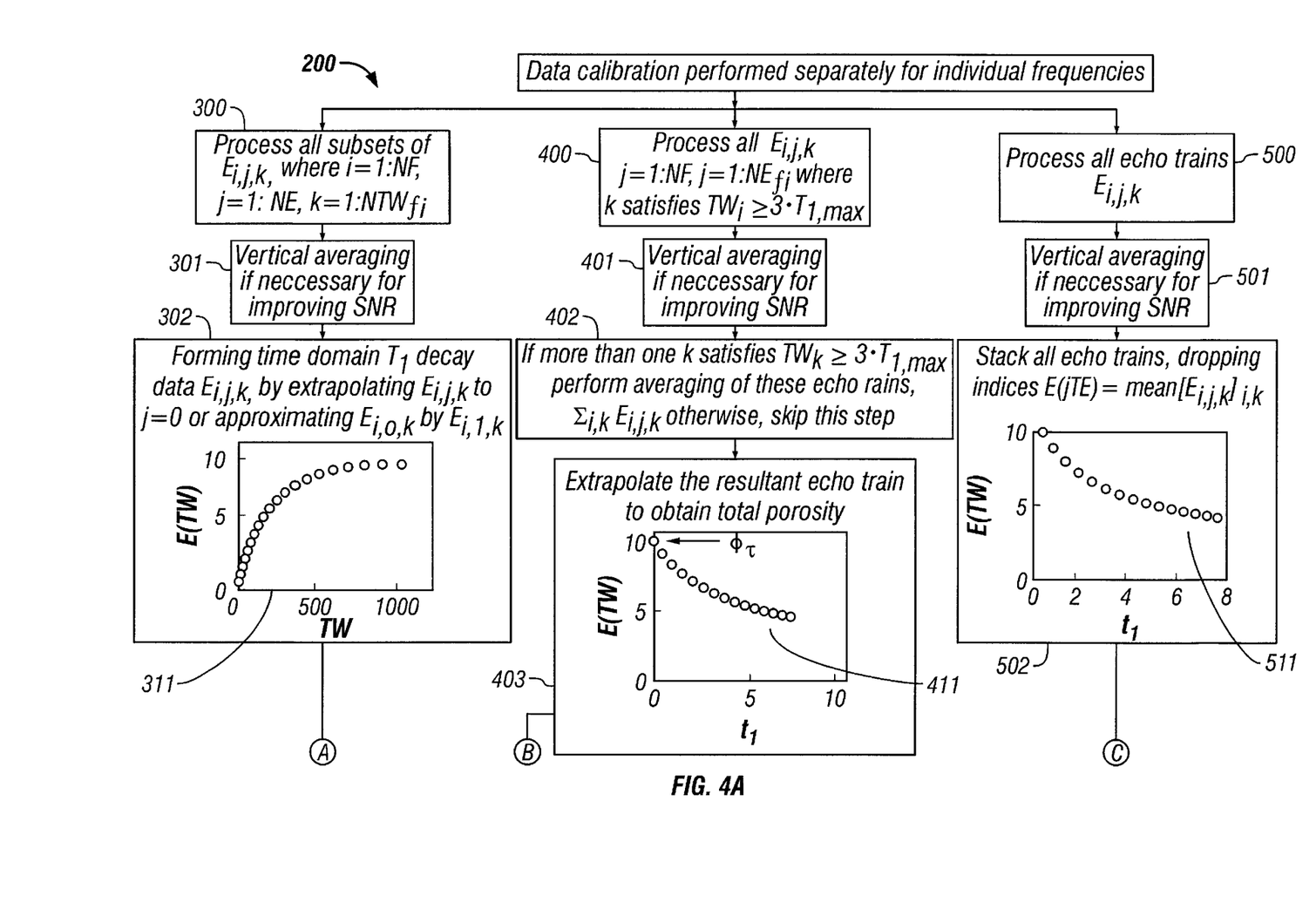
FIG. 4 is a flow chart illustrating the use of the interleaved pulse sequences for obtaining $T_1$ and $T_2$ spectra.
Figure 4B:
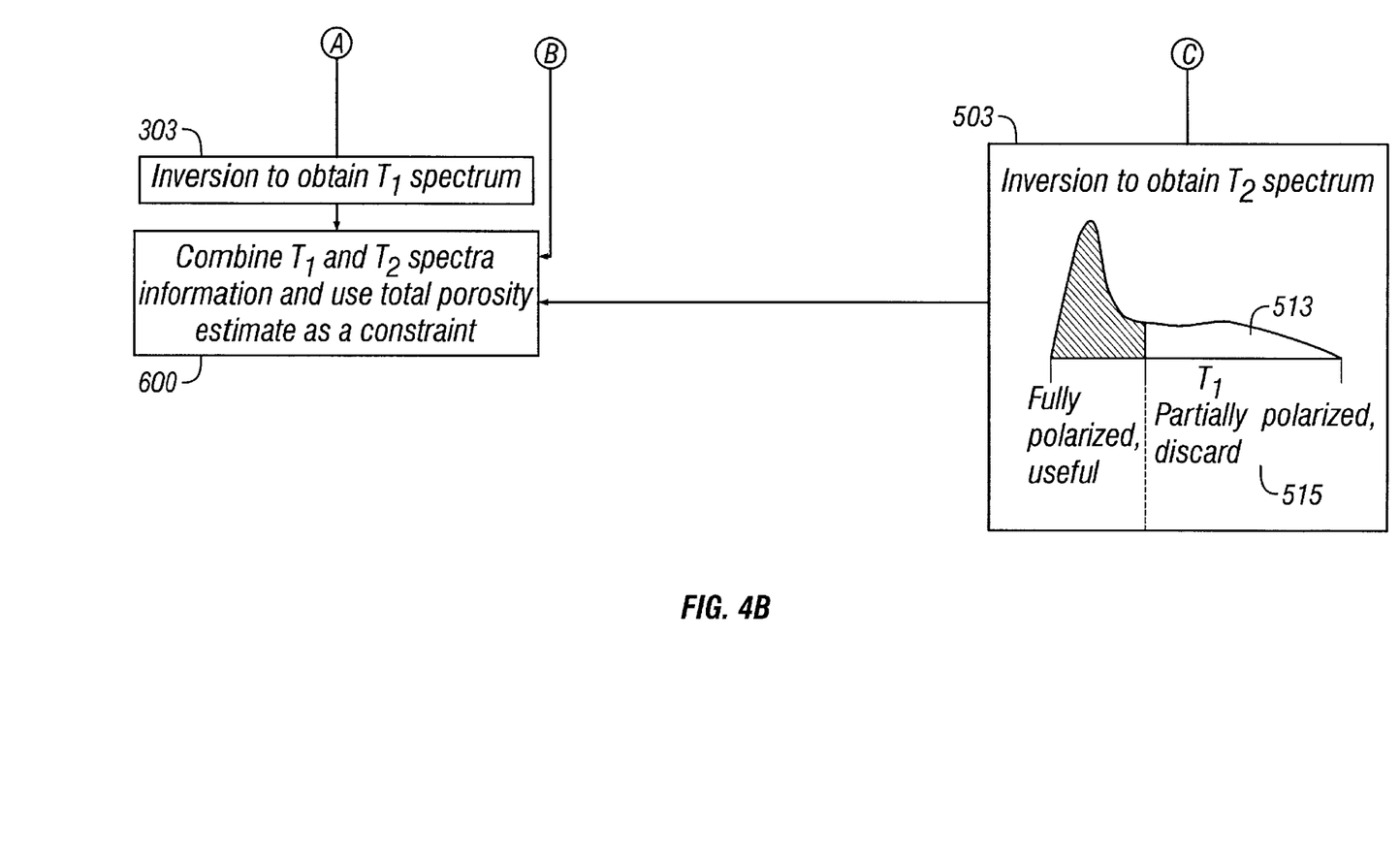

Turning now to FIG. 4, a flow chart of various steps that may be taken in the analysis of single or multi-frequency data using the interleaved sequences is shown. Denoting by $E_{i,j,k}$ the j-th echo for the i-th frequency with the k-th wait time, the following steps may be carried out for the calibrated data 200 for the individual frequencies.

The branch corresponding to 300 relates to the first echo $E_{i,1,k}$ for the one or more frequencies (index i) and the one or more wait times (index k). The pulse echo data are averaged vertically 301 if necessary to improve SNR and then the data from the different frequencies and different wait times are combined to form time domain polarization buildup data for $T_1$ recovery analysis as 311 as shown in the box 302. These are indicative of saturation recovery. The abscissa is the wait time $T_w$ and the ordinate is the amplitude of the corresponding first pulse echo. Inversion of this curve using prior art methods gives an estimate of the $T_1$ spectrum of the formation.

Figure 5:
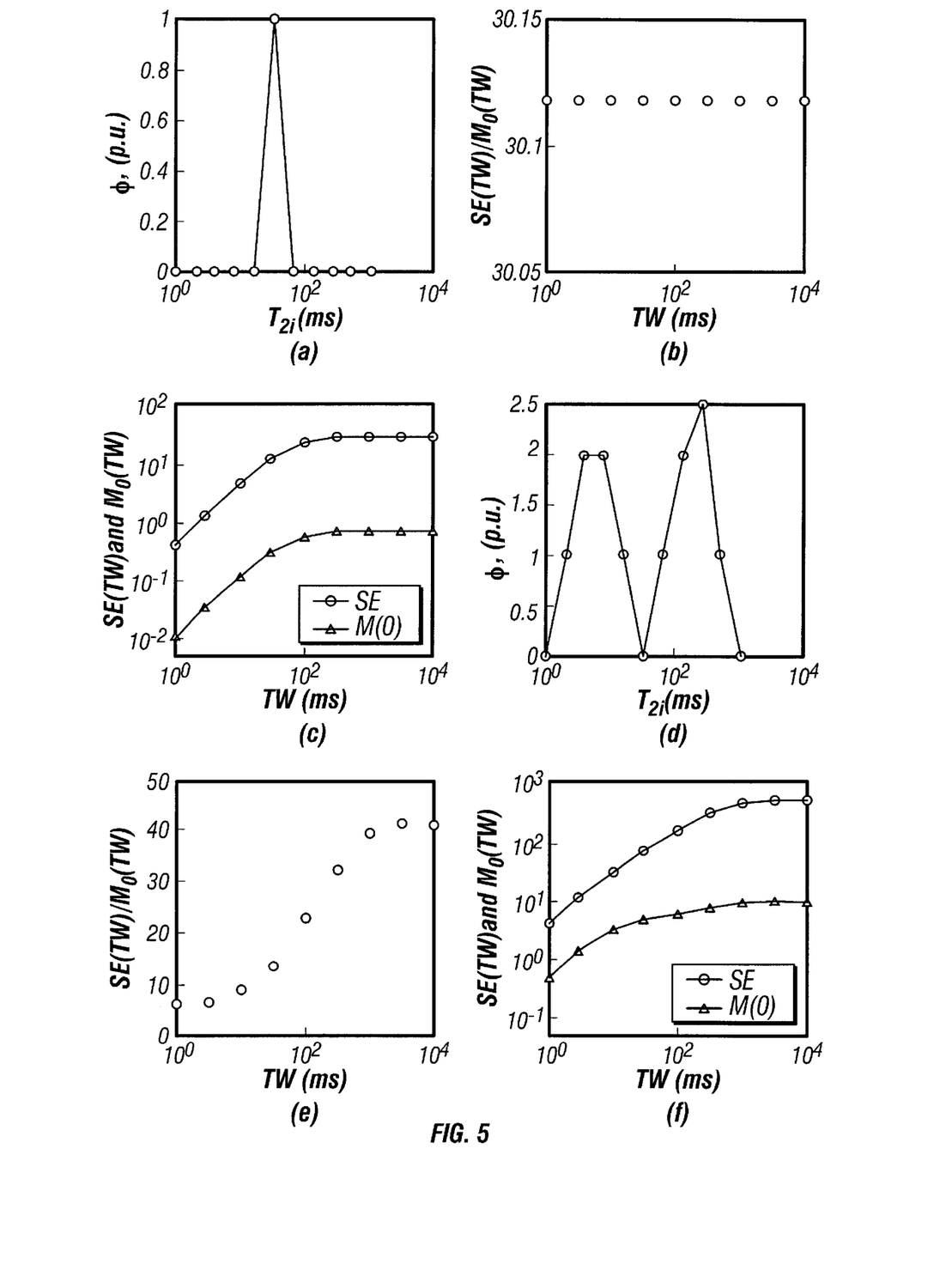
FIG. 5 shows the result of using the sum of echos, SE, as an approximation of-free induction decay, $M_0$, in $T_1$ analysis.

In another embodiment, all echos, $E_{i,j,k}$, acquired in each frequency (index i) are used to estimate $$E_{i,0,k} = \sum_u M_{0u} + \sum_v M_{0v}(1 - e^{-T_{wk}/T_{1v}}) \qquad (4)$$

by extrapolation of echo to j=0. After this, $E_{i,0,k}$ is used to replace $E_{i,1,k}$ in box 300. The use of a summation of echos has been described in Taicher '205 in a method of analyzing $T_1$ from SR/CPMG and IR/CPMG. In that method, only the sum of the echos in each CPMG sequence need be measured in order to increase the overall signal-to-noise ratio. The substitution of the sum of echos, SE,—for free induction decay, $M_0$, in $T_1$ estimation is applicable for systems that contain a single component $T_1$ and $T_2$ or can be approximated with a single component. However, the accuracy may not be as good when the relaxation time distribution is broad, as illustrated in FIG. 5. In this figure, Plots (a) through (c) represent single exponential decay and (d) through (f) a broad, bimodal distribution. The plots (a) and (d) show the distribution, the plots (b) and (e) the sum of echos (SE) divided by the free induction decay, ($M_0$), and the plots (c) and (f) the SE and M(0) as functions of wait time TW. The ratio of $SE/M_0$ is constant for the single exponential case but varies for multi components. For the latter, one cannot use the summation of echos to substitute the FID signals.

Going back to FIG. 4, the branch corresponding to 400 relates to those echo trains which are acquired with a wait time $T_{wk} \geq 3T_{1,max}$ where $T_{1,max}$ is a maximum value of the expected longitudinal relaxation time of the formation. These correspond to full polarization of the spins in the formation prior to the application of the refocusing pulses. The data are vertically averaged if necessary for improving the SNR 401. If more than one values of k satisfies the condition $T_{wk} \geq 3T_{1,max}$, then these echo trains may be averaged 402 over i and k (i.e., over frequencies and wait times) to give an averaged echo train 411 as shown in the box 403 where the abscissa is the echo number. The curve 411 corresponds to full polarization of the nuclear spins following the saturation pulse and extrapolation of the curve 411 back to the origin gives the total porosity φ, The branch corresponding to 500 involves processing of all the echos acquired using the interleaved pulse sequences described above. The data are vertically averaged if necessary for improving the SNR 401. Next, all the echo trains are averaged over the indices i and k (i.e., over frequency and wait times) to give an averaged summed pulse sequence echo sequence E (j τ) 511. Inversion of the curve 511 using prior art methods gives the $T_2$ spectrum 513.

The portion of the $T_2$ spectrum 513 less than a predetermined threshold 515 corresponds to fully polarized nuclear spins with a short relaxation time $T_2$. Information from the inverted $T_1$ from 303 may be combined with information from that portion of the $T_2$ spectrum 513 less than the predetermined threshold 515 using the total porosity $\phi_t$, from 403 as a constraint to give a characterization of the fluid and porosity distribution in the formation. Aside from the enhanced decay due to diffusion in a gradient field, reservoir fluids—$T_1$ and $T_2$ share the same relaxation mechanisms which forms the basis for combining the $T_1$ and $T_2$ information to form one single porosity spectrum. For example, the $T_2$ data provides formation from the minimal $T_2$ to $T_{2c}$, while the $T_1$ data provides porosity distribution for $T_{1 \geq T2c}$. However, because $T_1/T_2$ is greater than unity and the value is difficult to predict, a small overlap between $T_1$ and $T_2$ distributions is possible. Two methods are used to reduce the effect. In the first method, the $T_1$ buildup (recovery) data and the $T_2$ decay data are used together as inputs for inversion processing. In the second method, the collective porosity values from the $T_1$ and $T_2$ spectra:

$$\phi = \sum_{u:T_{2u} \leq T_{2c}} M_{0u} + \sum_{v:T_{1v} > T_{2c}} M_{0v} \quad (5)$$

must be in agreement with the total porosity $\phi$, estimation. If $\Delta\phi = \phi' - \phi_t \geq 0$, the excessive porosity $\Delta\phi$ is considered to be due to overlapping and the amount is subtracted from the shortest $T_1$ components.

In MWD/LWD applications, tool motion may prevent acquiring valid $T_2$ data, because tool motion gives rise to an apparent faster decay of the echo signal and makes it difficult to measure the intrinsic $T_2$. Acquisition of a valid echo train with a substantially long acquisition time interval (e.g. 1 s) requires minimal vibration for the entire $T_2$ acquisition, something that is difficult to maintain during MWD/LWD operations. If the measurement is started when there is little motion, then at least the early echos in the $T_2$ acquisition will be valid and representative of intrinsic $T_2$ processes. With the aid of auxiliary sensors (e.g. accelerometers) it is possible to determine how many of the initial echos are valid. The echos that are not corrupted by tool motion can then be used for analysis.

In the present invention, the minimization of the detrimental effects of tool vibrations to NMR measurements are achieved using two approaches, applied concurrently or separately. Firstly, the saturation pulses are made broader band than the recovery and refocusing pulses. Secondly, for $T_1$ measurements, an important step is the synchronization of sensitive volumes defined by the saturation pulses and the recovery/refocusing pulses. When the bandwidth of the saturation pulse is broader than the recovery and refocusing pulses, it simply means that the sensitive volume defined by the recovery and refocusing pulses must be substantially inside the sensitive volume defined by the saturation pulse. The synchronization of sensitive volume is only stringent at the moments when these pulses are applied. Any tool vibration that occurs during the wait time period, i.e., the time period between the saturation pulse and the recovery pulse, has no effect on the measurements. Thus, the vibration of the tool and the position of the sensitive volume can be sensed and the sensor data can be used to trigger the RF pulsing events.

The vibration-sensor trigger events can be implemented in three different ways to control RF pulsing events at three critical time instances of any subsequence. The first time instance is the onset of the saturation pulse. The saturation pulse trigger defines the sensitive volume position. It is preferred that the event is triggered at the moment the sensitive volume is positioned close to its equilibrium position, regardless of whether or not the tool is vibrating. The second time instance is the onset of the recovery pulse. The recovery pulse trigger activates when tool vibration is minimal and the sensitive volume substantially matches that of the saturation pulse. The third time instance is to control the end of the valid echo acquisition. This trigger activates when the motion is substantial so that the sensitive volume of the last echo is asynchronized from that of the first echo in the echo train.

In one embodiment of the invention, motion triggered pulsing is performed using a method disclosed in U.S. patent application Ser. No. 09/778,295 of Slade et al, the contents of which are fully incorporated herein by reference. In the teachings of Slade, a predictive filter, such as a Kalman filter, is used to analyze the output of motion sensors on the MWD tool. The motion sensor can be used to determine when to start echo train acquisition and when to stop the echo train. Using the output of the predictive filter, the acquisition of the CPMG echo trains may be delayed or speeded up relative to values selected on the basis of the methodology discussed above.

In one embodiment of the invention, MWD/LWD are made using a sensor assembly on a non-rotating sleeve that may be clamped to the borehole wall. Such an assembly is disclosed in U.S. Pat. No. 6,247,542 to Kruspe et al, the contents of which are fully incorporated herein by reference. This minimizes the effect of- tool motion effects on $T_2$ echo data.

As would be known to those versed in the art, in MWD applications the rate of movement of the tool along the borehole may be small. In MWD applications, the processing steps described above with reference to FIG. 4 may be used even at a single frequency. This may also be done with respect to wireline logging if the expense of additional logging time can be justified.

In one embodiment of the invention, the saturation pulses can be omitted because they are always preceded by the refocusing pulses of the prior subsequence. In the preferred embodiment, however, saturation pulses are retained because they provide a more precise means to control the desired wait times. The precise timing become more important when the saturation pulses are also motion-sensor triggered, as described above. PCT publication WO01/13142 based on U.S. Provisional Patent Application 60/148, 943 describes a pulse sequence in which the saturation pulses are absent.

In an alternate embodiment of the invention, the saturation pulses described above may be replaced by inversion pulses. However, saturation recovery pulse sequences acquire data faster than inversion recovery sequences and are hence preferred.

While the foregoing disclosure is directed to the preferred embodiments of the invention, various modifications will be apparent to those skilled in the art. It is intended that all variations within the scope and spirit of the appended claims be embraced by the foregoing disclosure.

What is claimed is:

1. A method of nuclear magnetic resonance measurement of a medium, comprising:
   (a) magnetically polarizing nuclei in said medium with a static magnetic field;
   (b) defining at least two sensitive volumes of the medium, each said sensitive volume having an associated frequency of a radio frequency (RF) signal;
   (c) defining a pulse sequence associated with each of the at least two sensitive volumes, each said defined pulse sequence comprising at least one sub-sequence having a saturation pulse, a recovery pulse, at least one refocusing pulse, and a wait time between the saturation pulse and the recovery pulse;

(d) defining a distribution of time intervals ranging from a minimum time to a maximum time;

(e) selecting said plurality of wait times as having values substantially equal to time intervals from said distribution of time intervals; and (f) acquiring NMR pulse echo data using an acquisition pulse sequence comprising an interleaved sequence of said defined pulse sequences having said selected wait times.

2. The method of claim 1 wherein the at least one recovery pulse, saturation pulse and refocusing pulse of any of said defined pulse sequences are substantially non-overlapping with each of the at least recovery pulse, saturation pulse refocusing pulse of any of the other defined pulse sequences.

3. The method of claim 2 wherein a recovery pulse, the at least one refocusing pulse and a subsequent saturation pulse of at least one sub-sequence associated with one of the at least two sensitive volumes occurs during a wait time following a saturation pulse of a sub-sequence of another of the at least two sensitive volumes.

4. The method of claim 1 wherein said interleaved sequences are one of (i) regularly interleaved, and, (ii) irregularly interleaved.

5. The method of claim 1 wherein said distribution of time intervals further comprises intervals of duration $3^{nk}$ ms. wherein n is an integer and k is a non-negative number.

6. The method of claim 5 wherein said distribution of time intervals further comprises between 22 and 43 time intervals.

7. The method of claim 1 wherein a time interval between a recovery pulse and a subsequent at least one refocusing pulse of each sub-sequence of at least one of said sensitive volumes has a defined value.

8. The method of claim 1 wherein a bandwidth of a saturation pulse is greater than or equal to a bandwidth of a recovery pulse and a refocusing pulse for each sub-sequence of each defined pulse sequence.

9. The method of claim 1 wherein, for each combination of the at least two sensitive volumes, a bandwidth of a saturation pulse for each of the defined pulse sequences is less than a separation of said associated frequencies.

10. The method of claim 9 wherein said separation is less than 40 kHz.

11. The method of claim 1 wherein a tipping angle of a refocusing pulse lies between 90° and 180°.

12. The method of claim 1 wherein said plurality of sub-sequences further comprises at least two sub-sequences at at least one frequency having the same wait time.

13. The method of claim 12 wherein the at least one refocusing pulse of a first and a second of said at least two sub-sequences have phases of +90° and −90°.

14. The method of claim 1 further comprising determining from said NMR pulse echo data a $T_1$ spectrum of said medium.

15. The method of claim 14 wherein determining the $T_1$ spectrum of said medium further comprises forming a time domain $T_1$ evolution data by combining recovery pulse signals for the at least two sensitive volumes and the associated sub-sequences.

16. The method of claim 15 wherein determining the $T_1$ spectrum of said medium further comprises inverting said time domain $T_1$ evolution data.

17. The method of claim 1 wherein the defined pulse sequence associated with one of the at least two sensitive volumes comprises a plurality of sub-sequences having different wait times, each of said plurality of sub-sequences comprising a plurality of refocusing pulses, the method further comprising determining from said NMR pulse echo data a $T_2$ spectrum of said medium.

18. The method of claim 17 wherein determining the $T_2$ spectrum of said medium further comprises averaging said pulse echo data over the at least two sensitive volumes and the plurality of wait times and inverting said averaged pulse echo data.

19. The method of claim 18 wherein determining said $T_2$ spectrum of said medium further comprises determining, for at least one of the sequence of refocusing pulses, a sum of values of an associated echo over a subset of the plurality of sub-sequences.

20. The method of claim 17 further comprising determining from said NMR pulse echo data a $T_1$ spectrum of said medium.

21. The method of claim 20 wherein determining the $T_1$ spectrum of said medium further comprises forming time domain $T_1$ evolution data by combining recovery pulse signals for the at least two sensitive volumes and the associated sub-sequences.

22. The method of claim 21 wherein determining the $T_1$ spectrum of said medium further comprises inverting said time domain $T_1$ evolution data.

23. The method of claim 22 further comprising combining the determined $T_1$ spectrum of said medium and the determined $T_2$ spectrum of said medium.

24. The method of claim 23 wherein combining the determined $T_1$ and $T_2$ spectra further comprises determining a total porosity of the medium and using said determined total porosity as a constraint.

25. A method of determining a parameter of interest of subsurface earth formations, comprising:

(a) conveying a logging tool into a borehole in the earth formations;

(b) using a magnet on the logging tool for magnetically polarizing nuclei in said medium with a static magnetic field;

(c) defining at least two sensitive volumes of the earth formations, each said sensitive volume having an associated frequency of a radio frequency (RF) signal;

(d) defining a pulse sequence associated with each of the at least two sensitive volumes, each said defined pulse sequence comprising at least one sub-sequence having a saturation pulse, a recovery pulse, a plurality of refocusing pulses, and a wait time between the saturation pulse and the recovery pulse;

(e) defining a distribution of time intervals ranging from a minimum time to a maximum time;

(f) selecting said plurality of wait times as having values substantially equal to time intervals from said distribution of time intervals; and (g) using at least one antenna on the logging tool and acquiring NMR pulse echo data using an acquisition pulse sequence comprising an interleaved sequence of said defined pulse sequences having said selected wait times.

26. The method of claim 25 wherein said logging tool is conveyed into the borehole on one of (i) a wireline, (ii) a drillstring, and, (iii) coiled tubing.

27. The method of claim 26 wherein the plurality of recovery pulses, saturation pulses and the at least one refocusing pulse of any of said defined pulse sequences are substantially non-overlapping with the plurality of recovery pulses, saturation pulses and the at least one refocusing pulse of any of the other defined pulse sequences.

28. The method of claim 25 wherein a time interval between a recovery pulse and a first subsequent refocusing pulse of each sub-sequence of at least one of said sensitive volumes has a defined value.

29. The method of claim 25 wherein said logging tool is part of a bottom hole assembly used in drilling, the method further comprising:
   (i) using motion sensors on the bottom hole assembly to produce signals indicative of motion of said bottom hole assembly and the logging tool, and
   (ii) adjusting said selected time of at least one of: (A) the saturation pulse, (B) the recovery pulse, (C) one of the refocusing pulses, and, (D) a last one of said refocusing pulses, in response to said motion signals.

30. The method of claim 29 further comprising using a predictive filter to analyze said motion signals.

31. The method of claim 25 wherein the defined pulse sequence associated with one of the at least two sensitive volumes comprises a plurality of sub-sequences having different wait times, each of said plurality of sub-sequences comprising a plurality of refocusing pulses, the method further comprising determining from said NMR pulse echo data a $T_2$ spectrum of said earth formations.

32. The method of claim 31 wherein determining the $T_2$ spectrum of said earth formations further comprises averaging said pulse echo data over the at least two sensitive volumes and the plurality of wait times and inverting said averaged pulse echo data.

33. The method of claim 32 wherein determining said $T_2$ spectrum of said earth formations further comprises determining, for at least one of the sequence of refocusing pulses, a sum of values of an associated echo over a subset of the plurality of sub-sequences.

34. The method of claim 33 further comprising determining from said NMR pulse echo data a $T_1$ spectrum of said earth formations.

35. The method of claim 31 wherein determining the $T_1$ spectrum of said earth formations further comprises forming time domain $T_1$ evolution data by combining recovery pulse signals for the at least two sensitive volumes and the associated sub-sequences and inverting said time domain $T_1$ evolution data.

36. The method of claim 35 further comprising combining the determined $T_1$ spectrum of said earth formations and the determined $T_2$ spectrum of said earth formations.

* * * * *